United States Patent
Nakamoto et al.

(10) Patent No.: US 6,827,827 B2
(45) Date of Patent: Dec. 7, 2004

(54) METAL PLATING APPARATUS AND PROCESS

(75) Inventors: Johji Nakamoto, Koga-gun (JP); Tatsuji Yamada, Ohmihachiman (JP)

(73) Assignee: International Business Machines Corporation, Armonk, NY (US)

( * ) Notice: Subject to any disclaimer, the term of this patent is extended or adjusted under 35 U.S.C. 154(b) by 419 days.

(21) Appl. No.: 09/681,712

(22) Filed: May 24, 2001

(65) Prior Publication Data

US 2001/0054556 A1 Dec. 27, 2001

(30) Foreign Application Priority Data

May 24, 2000 (JP) .......................................... 2000-152494

(51) Int. Cl.[7] .............................................. C25D 17/10
(52) U.S. Cl. ................................ 204/230.2; 204/230.7; 204/268; 204/DIG. 7; 205/96
(58) Field of Search .......................... 204/230.2, 230.7, 204/268, DIG. 7; 205/96, 97

(56) References Cited

U.S. PATENT DOCUMENTS

| | | | |
|---|---|---|---|
| 4,043,891 A | * | 8/1977 | Alkire et al. ............ 204/230.7 |
| 5,300,208 A | * | 4/1994 | Angelopoulos et al. ........ 205/50 |
| 6,291,761 B1 | * | 9/2001 | Takada et al. .............. 136/244 |

FOREIGN PATENT DOCUMENTS

JP         PUPA07-228992         8/1995

OTHER PUBLICATIONS

The Condensed Chemical Dictionary, seventh edition, Arthur Rose et al, Reinhold Book Corporation, 1968, pp. 246.*

* cited by examiner

*Primary Examiner*—Roy King
*Assistant Examiner*—William T. Leader

(57) ABSTRACT

In order to make plating thickness uniform in a metal plating apparatus, a metal plating apparatus capable of performing metal plating to a uniform thickness is provided by aligning lines of electric force uniformly and in parallel by disposing a pair of conductive perforated plates 20a and 20b, which are electrically connected to each other, between plating metals 16 immersed in a plating solution and an object 18 to be plated.

21 Claims, 6 Drawing Sheets

Test Result of Electrolytic Film Thickness

METAL PLATING APPARATUS AND PROCESS

BRIEF SUMMARY OF THE INVENTION

1. Field of the Invention

The present invention relates to a metal plating apparatus and a process for performing such plating. More particularly, it relates to a metal plating apparatus capable of uniformly carrying out plating, even though the distribution of metal portions on an object to be plated is not uniform.

2. Background

In a conventional metal plating method, a plating metal plate serving as an anode and an object to be plated serving as a cathode are immersed in a solution containing metal ions and a predetermined voltage is applied therebetween from an external power supply. A metal is deposited on the surface of the object serving as a cathode. On the other hand, an elution of metal ions occur on the metal plate serving as an anode. For instance, in a plating apparatus 100 shown in FIG. 7, an object 102 acting as a cathode and a copper plate 104 acting as an anode are disposed and then are immersed in a plating solution tank 106 including a copper-sulfate solution. The anode of a plating power supply 108 is connected to the copper plate 104 via a switch (not shown) and an ammeter, and the object 102 on which a plating layer should be formed is connected to the cathode of the plating power supply 108. The object 102 has electrically conductive regions that are to be plated on its surface. When a voltage is applied from the plating power supply 108 between the copper plate 104 and the electrically conductive regions of the object 102, copper cations in the electrolytic plating solution flow toward the object 102 to deposit metal copper on the surface of the object 102, so that a plating layer is formed on the electrically conductive regions of the object 102.

The amount of metal deposited on the object, that is, the plating thickness distribution is determined depending on the distribution of plating-current density. Lines of electric force 110, which indicate the paths of current flowing in electrolytic plating solution, extend toward the electrically conductive region of the object 102 as shown in FIG. 8. A problem arises in that the plating thickness is not uniform because of thicker metal deposition occurring at the ends of the electrically conductive region of the object 102, which is caused by the tendency of the lines of electric force to concentrate at the ends of the electrically conductive region.

Based on recent trends wherein electronic devices are decreasing in size, increasing in packaging density, and increasing in speed, plating processes for printed circuit boards that achieve thinner conductive lines, smaller diameter via holes, smaller diameter of lands as well as multi-layers are required. In multi-layer printed circuit boards, the plating thickness on the inner surfaces of through-holes, and via holes and the like provided for interlayer connection is required to be uniform. However, in pattern areas where a plurality of via holes are concentrated, the surface area to be plated increases because the inner surfaces of the holes need to be plated as well. In ordinary plating processes of printed circuit boards, a panel, whose wiring density of the wiring pattern is not uniform, is connected as a cathode. Accordingly, a non-uniform plating thickness occurs since the current density is low in a densely patterned area to be plated resulting in a locally thin plating layer while the current density is high in a less densely patterned area resulting in a locally thick plating layer.

Various kinds of techniques for solving the above problem and obtaining a uniform plating thickness have been developed. For instance, a current concentrated on end parts of an electrically conductive region may be controlled by mounting a shielding plate, or a pattern called a "dummy pattern", which is not required to function as an electric circuit, may be arranged on or near the printed circuit board. However, a shielding plate can avoid only a certain extent of the concentration of the lines of electric force on the end parts, so that the plating thickness still varies depending on whether the pattern is dense or not. Further, the dummy pattern reduces production efficiency because the dummy pattern must be added to the circuit pattern but the dummy pattern does not function as a electrically productive part of the circuit.

SUMMARY OF THE INVENTION

A first aspect of the present invention is to provide a metal plating apparatus and process capable of depositing metal on an object in a uniform thickness.

A second aspect of the present invention is to provide a metal plating apparatus and process capable of plating in a uniform thickness, even if the distribution of metal portions on an object to be plated is not uniform.

A third aspect of the present invention is to provide a metal plating apparatus and process capable of performing metal plating in a uniform thickness in a short time at high electric current.

The metal plating apparatus according to the present invention includes a pair of electrically connected conductive perforated plates. The metal plating apparatus of the present invention having the above structure can substantially align in parallel the lines of electric force created in a plating bath.

Another embodiment of the metal plating apparatus according to the present invention includes an insulating adjustment plate with a plurality of windows. The metal plating apparatus of the present invention having such a structure is capable of making the current density at the metal portions to be plated constant and thus plating each of the metal portions with a uniform thickness, even if the distribution of the metal portions to be plated is not uniform.

Still another embodiment of the metal plating apparatus according to the present invention includes a pair of conductive perforated plates electrically connected to each other and an adjustment plate with a plurality of windows. The metal plating apparatus of the present invention having the above structure is capable of making the lines of electric force between the plating metal and the object uniform and parallel, as well as making the current density at each portion to be plated constant and the plating thickness uniform.

As described above, according to the metal plating apparatus of the present invention, non-uniformity of lines of electric force is improved by conductive perforated plates. Furthermore, uniform plating thickness can be obtained by providing the current density corresponding to the area to be plated using an insulating adjustment plate. The present invention can dramatically improve productivity by uniformly obtaining a desired plating thickness under the plating conditions of high current density and short processing time, which are difficult in the prior art. Moreover, conductive perforated plates and an insulating adjustment plate may be added to the conventional metal plating apparatus, so that excellent uniformity in plating thickness can be obtained.

In the metal plating apparatus of the present invention, productivity can be improved by dramatically decreasing plating thickness non-uniformity. As a result, the metal plating apparatus is applicable to plating techniques required to provide a precise and uniform plating thickness.

DETAILED DESCRIPTION OF THE INVENTION

Description of the Preferred Embodiments

Next, based on the drawings, preferred embodiments of the metal plating apparatus and process related to the present invention are described in detail below. The metal plating apparatus according to the present invention can deposit metal uniformly on an object to be metal plated. The metal plating apparatus comprises a source material (a plating metal) electrically connected to a first terminal (anode) of a plating power supply; an object to be plated which is electrically connected to a second terminal (cathode) of the plating power supply; and at least a pair of conductive perforated plates and/or an insulating adjustment plate disposed between the source material and the object, wherein the source material, the object, and the at least a pair of conductive perforated plates and/or the insulating adjustment plate are immersed in a plating solution and a voltage is applied between the source material and the object.

Figure 1:
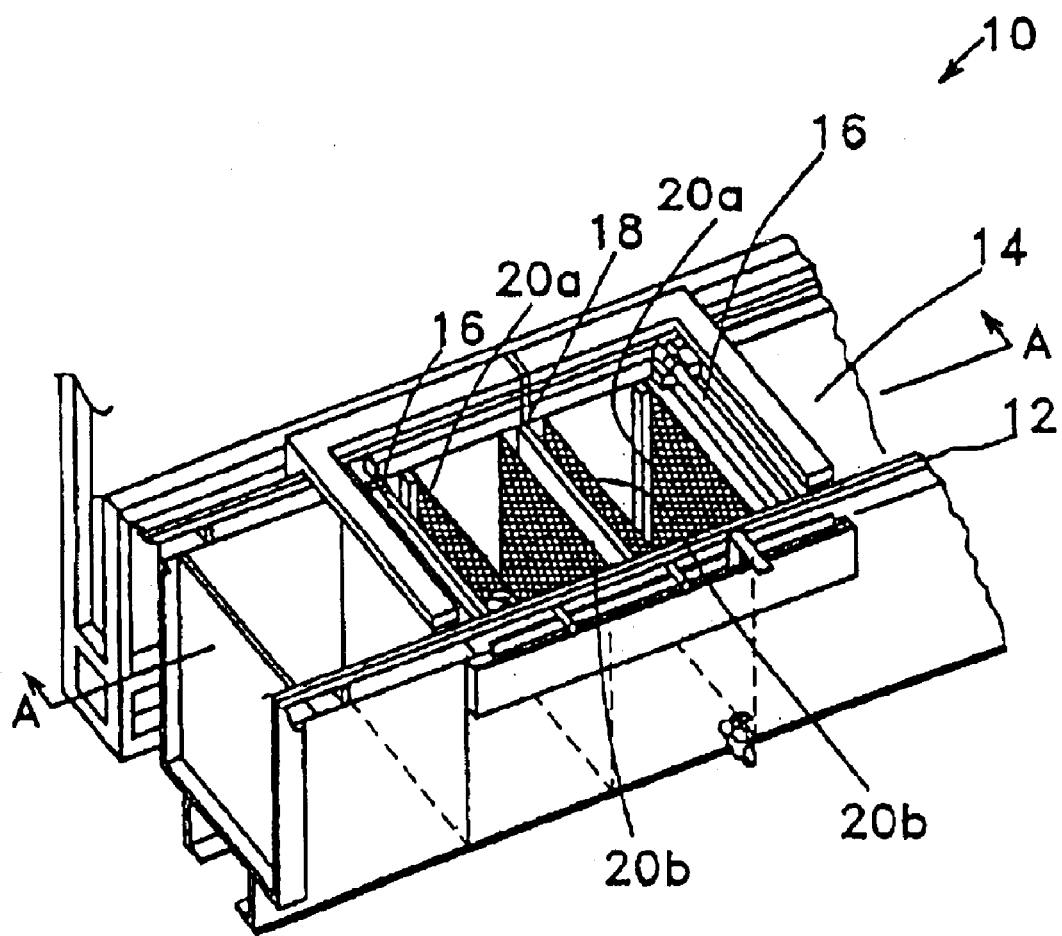
FIG. 1 is a partial perspective view of an example of a metal plating apparatus according to the present invention.
Figure 2:
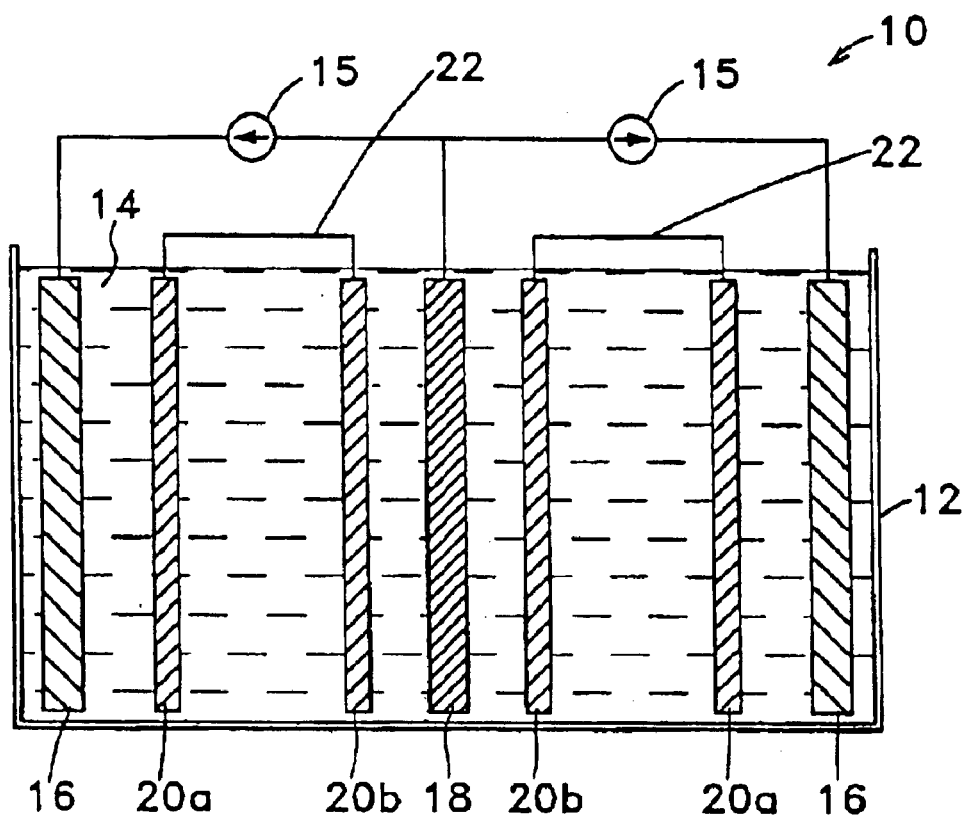
FIG. 2 is a cross-sectional schematic diagram of another example of the metal plating apparatus according to the present invention shown in FIG. 1.

FIG. 1 shows an example of a structure of a metal plating apparatus 10 of the present invention. FIG. 2 is an A—A cross-sectional schematic diagram of the metal plating apparatus 10 shown in FIG. 1. In this embodiment, it is assumed that both surfaces of an object are simultaneously plated and plating metals are provided on both sides of the object. It is also possible to plate only one side of the object by arranging one plating metal for the object.

In the metal plating apparatus 10 of this embodiment, a plating solution tank 12 is filled with a metal plating solution 14. Plating metals 16 are electrically connected to an anode of a plating power supply 15 and an object 18 is electrically connected to a cathode of the plating power supply 15. A pair of conductive perforated plates 20a and 20b are provided between the object 18 and each of the plating metals 16. The plate 20a of each pair is disposed on the side of the plating metal 16 and the plate 20b of each pair is disposed on the side of the object 18. The conductive perforated plates 20a and 20b of each pair are electrically connected to each other.

Typical examples of metals for use in plating metals 16 are Cu, Ag, Au, Zn, Cd, In, Sn, Pb, Cr, Fe, Co, Ni, Pt, and Rh, or the like. In addition, alloys such as Cu—Zn, Cu—Cd, Au—Ag, Au—Cu, Ag—Cd, Sn—Zn, Ni—Sn, Pb—Sn, Ni—Zn, Ni—Co, and Ni—Mo may be typically used for the plating metals 16. The type of metal or metal alloy used may be selected based on each individual use. For example, copper or copper alloy is used for plating a printed circuit board, and the like. The plating metals 16 may be in any shape, such as a plate shape, bar shape, or spherical shape.

When a soluble metal is used for the plating metals 16, metal ions can be provided to the plating solution 14. For example, when a copper plating, whose plating solution is a copper-sulfate solution, is performed, copper ions can be provided to the plating solution from copper connected to an anode.

The pair of conductive perforated plates 20a and 20b disposed between the plating metals 16 and the object 18 need to be electrically conductive. Preferably, metal materials such as copper, titanium, and stainless steel are used for the conductive perforated plates. More preferably, titanium and stainless steel having chemical resistance, which are not subject to corrosion by the plating solution, are used. Additionally, a metal such as copper coated with titanium may be used.

The conductive perforated plates 20a and 20b may be a net with mesh-like holes or a plate with holes formed by notching, drilling, or punching. The holes are preferably of the same size and uniformly distributed on the entire surfaces of the perforated plates. The minimum size of the respective holes is limited only in that the plating solution is allowed to pass through the holes freely. Further, the portions other than the holes of the perforated plate preferably have sufficient strength to a degree that the perforated plate cannot be deformed by a movement of the solution within the plating bath. The smaller total area of the portions other than the holes is preferred because it can reduce the area of metal deposition. For example, conductive perforated plates having holes 5 mm square at intervals of 0.5 mm may be used. For the purpose of aligning the lines of electric force parallel to each other, it is preferable that the entire shape and size of the conductive perforated plates are substantially the same as those of the object to be plated.

The conductive perforated plates 20a and 20b are arranged in parallel to each other between the plating metals 16 and the object 18, and the conductive perforated plates 20a and 20b face the plating metals 16 and the object 18 respectively. This layout is intended to lead the lines of electric force extending from the plating metals 16 to the object 18 in a constant direction, as well as aligning the lines of electric force uniformly and in parallel when a direct current is fed between the plating metals 16 and the object 18.

The conductive perforated plates 20b on the object 18 side are preferably in the vicinity of the object 18 so that the lines of electric force adjusted by the conductive perforated plates function to deposit a metal on the object 18 while maintaining a constant direction of the lines of electric force. However, when the conductive perforated plates 20b are in contact with the object 18, the perforated plates 20b become integrated with the cathode, which results in no effect in aligning the lines of electric force in parallel and uniformly, so the purpose of the present invention is not achieved. For this reason, it is necessary to place the perforated plates 20b in the vicinity of the object 18 to such a degree that the perforated plates 20b are not in contact with the object 18. In a metal plating apparatus having a spacing of 30 cm between the plating metals 16 and the object 18, the spacing between the conductive perforated plates 20b and the object 18 is preferably about 10 cm or less, more preferably about 2 cm or less.

The conductive perforated plates 20a and 20b of each pair are electrically connected to each other by a conductor 22, and are electrically separated from the plating metals 16 and the object 18. The electric separation of the conductive perforated plates 20a and 20b from the plating metals 16 and the object 18 creates an electric field between the conductive perforated plates 20a and 20b independently of the plating current. Because of the above structure, the conductive perforated plates 20a facing the plating metals 16 become negatively charged when an anode current is fed to the plating metals 16. Further, the conductive perforated plates 20b facing the object 18 become positively charged when a cathode current is fed to the object 18. Electrical connection of the conductive perforated plates 20a and 20b to each other substantially removes the difference in voltage between the conductive perforated plates 20a and 20b, so the deposition of metal on the surface of the perforated plates 20a facing the plating metals 16 is minimized.

In a conventional metal plating apparatus, the distribution of lines of electric force is concentrated on the ends of the cathode, which causes thickness non-uniformity of the plating layer. On the contrary, in the present invention, equi-voltage surfaces between the conductive perforated plates 20a and 20b are kept parallel to the surfaces of the conductive perforated plates, and the lines of electric force are distributed uniformly and in parallel. Accordingly, a plating layer having a uniform thickness can be formed on the surface of the object 18 to be plated.

Here, the accuracy of uniformity in the plating thickness can be statistically represented by a coefficient of variance. Specifically, the coefficient of variance is as follows:

$$\text{Coefficient of variance}(C.V. \%) = \frac{\text{(Standard deviation of measured values of plating thickness)}}{\text{(Average thickness of measured values)}} \times 100 \quad \text{Equation 1}$$

For example, to determine the coefficient of variance (C. V. value (%)), plating thickness is measured at 9 sample points on a printed circuit board of 500 mm×600 mm which is the object to be plated. In this case, while the C. V. value of plating thickness using a conventional metal plating apparatus is in a range of 10 to 30%, the value of plating thickness according to the metal plating apparatus of the present invention may be from about 3 to about 7%.

The conductive perforated plates 20a and 20b are electrically connected to each other by one or a plurality of conductors 22. The shape of the conductor 22 may be any of a wire, bar, plate, or the like.

Figure 3:
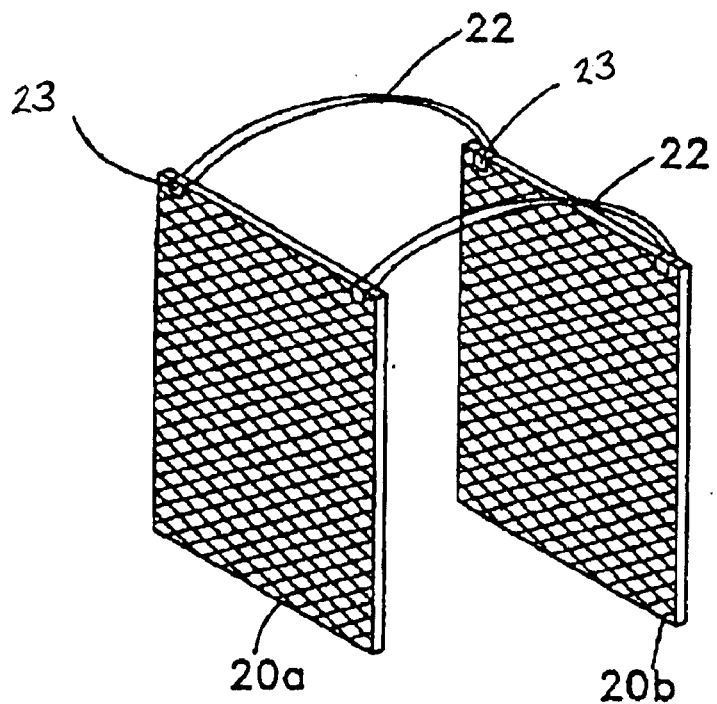
FIG. 3 shows an embodiment of conductive perforated plates disposed within the metal plating apparatus according to the present invention shown in FIG. 2.

The material of the conductor 22 is not particularly limited, but copper, having excellent conductivity, may be used. As well, it is preferred that the material have chemical resistance to the plating solution. For example, as shown in FIG. 3, the ends of the perforated plates 20a and 20b may be supported from both sides thereof by providing clips 23 on both ends of the conductor 22, wherein the clips 23 are copper wires covered with vinyl chloride.

Two or more pairs of conductive perforated plates 20a and 20b electrically connected to each other may be disposed between the plating metal 16 and the object 18. Further, in the plating process, metal deposition is seen to some degree on the perforated plates 20a facing the plating metals 16. To remove this deposition, the perforated plates 20a on the plating metal side and the perforated plates 20b on the object side may be exchanged with each other after being used for a fixed period of time so that the metal deposited on the surfaces of the perforated plates 20a on the plating metal side can be dissolved.

Figure 4:
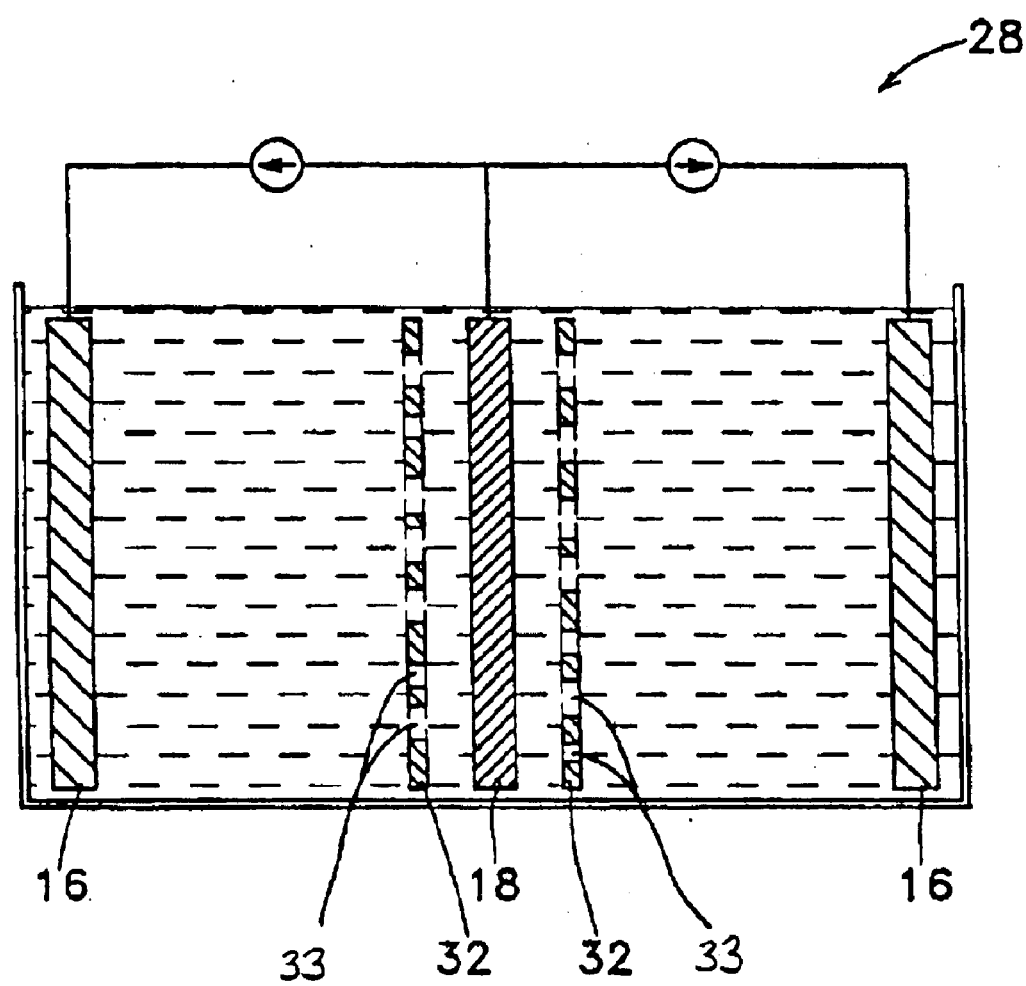
FIG. 4 is a cross-sectional schematic diagram of still another example of the metal plating apparatus according to the present invention.

FIG. 4 shows another embodiment of the metal plating apparatus according to the present invention. The metal plating apparatus 28 shown in FIG. 4 has an insulating adjustment plate 32. The insulating adjustment plate 32 is preferably disposed in the vicinity of the object 18. In addition, as a further embodiment of the metal plating apparatus, the insulating adjustment plate 32 may be provided in combination with the above-mentioned conductive perforated plates 20a and 20b. For example, as shown in a metal plating apparatus 30 of FIG. 5, the adjustment plate 32 is disposed on the surface of each conductive perforated plate 20b, which is facing the object.

The insulating adjustment plate 32 aims to adjust the amount of the lines of electric force, i.e., the amount of current, reaching the object 18 and provide constant current density over the whole region to be plated, depending on the distribution of metal portions of the metal pattern to be plated on the object 18, that is, the area of the metal portions per unit area of the metal pattern to be plated.

For the purpose of adjusting the amount of current which reaches the object 18, the insulating adjustment plate 32 has a plurality of windows 33 or openings so that the lines of electric force may either pass through the windows or are shielded by the plate. The total area and number of these windows 33, and the area and location of each window correspond to the metal portions of the object 18 to be plated.

For example, when a panel for a printed circuit board electrically connected to a cathode is plated with copper, through hole wiring and via hole wiring for interlayer electrical connection are required to be formed as well as a wiring pattern on each surface of the circuit board. In this case, due to the differences in shape of the wiring pattern, location and number of through holes and photo-via holes, the surface area to be plated per unit area may vary from location to location. In the present invention, the windows of insulating adjustment plates are designed in accordance with information on the pattern density obtained at the design stage for a circuit pattern of a printed circuit substrate so that the current density on the printed circuit board is uniform. More specifically, first, average current density is determined from the pattern density and the plating current/voltage. The total area and number of the windows 33 of the insulating adjustment plate 32, and the area and the location of each window are designed in correlation with the pattern density so that the current density is substantially constant at a value corresponding to the average current density. The design of the windows 33 is carried out for each printed circuit board having a different wiring pattern. When both surfaces of the printed circuit board are plated, the above-described design is carried out for each surface.

The size of each window is preferably in the range of from about 0.1 to about 10 mm, but the size may be more than 10 mm, and it is determined in accordance with the pattern density of the conductive regions on the printed circuit board. The number of the windows is determined based on the total area of the necessary windows. According to such a design, windows may be automatically provided by a computer controlled drilling machine used to form functional holes, such as through holes and via holes in the printed circuit board.

It is required that the adjustment plate 32 be electrically insulating. An electrically conductive plate is not suitable for the purpose of adjusting the lines of electric force due to deposition of metal on the adjustment plate 32. The typical materials for the adjustment plates 32 are synthetic resin sheets, such as polyester resin, polypropylene resin, polyethylene resin, polyvinylidene fluoride, epoxy resin, phenol resin, and polyimide resin, or the like, and sheets in which these materials are impregnated into include a glass fabric and a composite base material, for example, a glass epoxy substrate may be preferably used.

Figure 5:
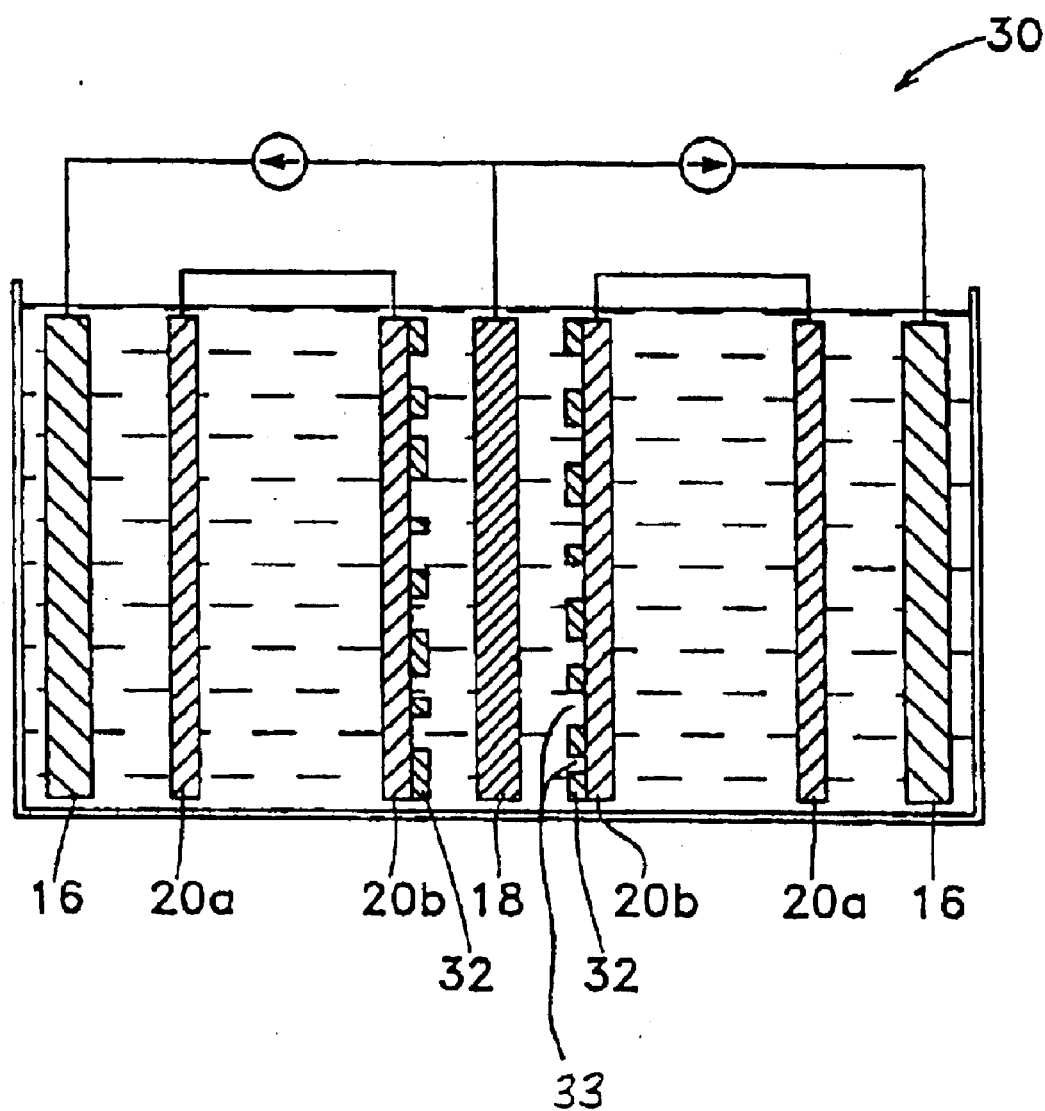
FIG. 5 is a cross-sectional schematic diagram of a further example of the metal plating apparatus according to the present invention.

The insulating adjustment plates 32 may be, as shown in FIG. 4, disposed in the vicinity of the object 18, facing the object 18. In the metal plating apparatus having conductive perforated plates, the adjustment plates 32 may be disposed between the conductive perforated plates 20b and the object 18. Alternatively, as shown in FIG. 5, the adjustment plates may be mounted on the surface of the perforated plates 20b on the object 18 side. The adjustment plate 32 is preferably similar to the perforated plates 20a and 20b in size and shape.

Using the insulating adjustment plate 32 and the conductive perforated plates 20a and 20b together at the same time enables uniform plating for plating thicknesses on the order of 10-2 $\mu$m or more, regardless of the distribution of the metal portions on an object 18 to be plated. For instance, according to the metal plating apparatus of the present invention, in the case of a printed circuit board having dimensions of 500 mm×600 mm, the C.V. value is from about 1% to about 3% as determined from measured values of the plating thickness at 9 sample points.

EXAMPLES

Comparative Example

Figure 6A:
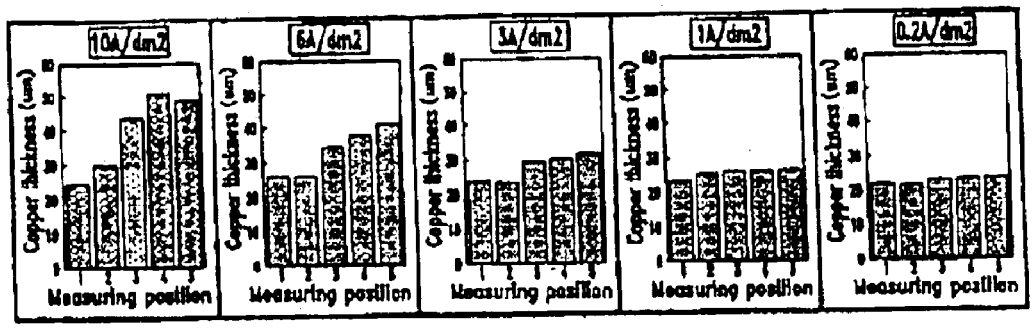
FIGS. 6(a) to 6(c) respectively show a graph of plating thickness measured for each current density by plating in a Haring Cell using a conventional metal plating apparatus (FIG. 6(a)), a metal plating apparatus of the present invention equipped with perforated plates (FIG. 6(b)), and the metal plating apparatus of the present invention equipped with perforated plates and an adjustment plate (FIG. 6(c)).

Plating was carried out by a conventional metal plating apparatus. A copper clad laminate (60 mm×100 mm) coated with a copper foil having a thickness of 1.8 mm on a 0.8 mm-thick glass epoxy substrate was used as an object to be plated, and was electrically connected to a cathode. A copper plate containing phosphorus was used as a plating metal and was electrically connected to an anode. A plating solution used was an aqueous solution including copper-sulfate in a concentration of 80 g/l as a major constituent and further including sulfuric acid, hydrochloric acid, and additives such as a brightener. A Haring Cell of standard shape and size was used as a plating tank. The total current in electrolytic treatment was 2A. Respective portions were sampled to measure plating thickness at five sample points for plating current densities of 10A/dm$^2$, 6A/dm$^2$, 3A/dm$^2$, 1A/dm$^2$, and 0.2A/dm$^2$. The result is shown in FIG. 6(a).

Example 1

Figure 6B:
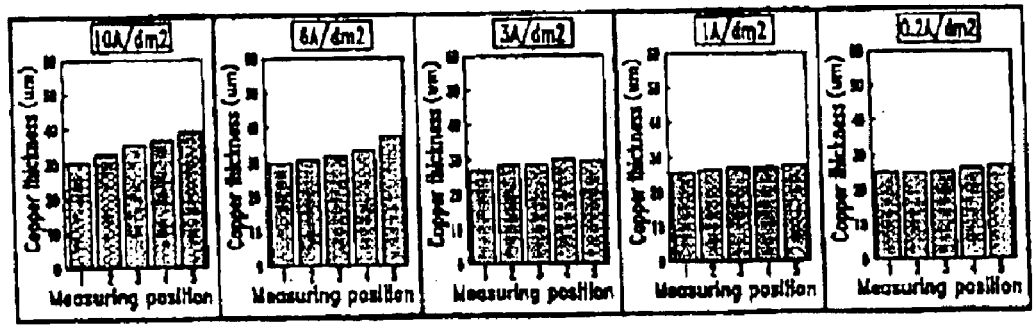

Plating was performed using a metal plating apparatus of the present invention equipped with conductive perforated plates. Operating conditions used were the same as those of the Comparative Example except the perforated plates were made of titanium (thickness=0.5 mm, size of hole =5 mm square, distance between the holes=0.5 mm). The spacing between the copper plate containing phosphorus and each of the perforated plates made of titanium was 1 cm, and the spacing between the circuit board and each of the perforated plates made of titanium was 1 cm. Respective portions were sampled to measure plating thickness at five sample points for plating current densities of 10A/dm$^2$, 6A/dm$^2$, 3A/dm$^2$, 1A/dm$^2$, and 0.2A/dm$^2$. The result is shown in FIG. 6(b).

Example 2

Figure 6C:
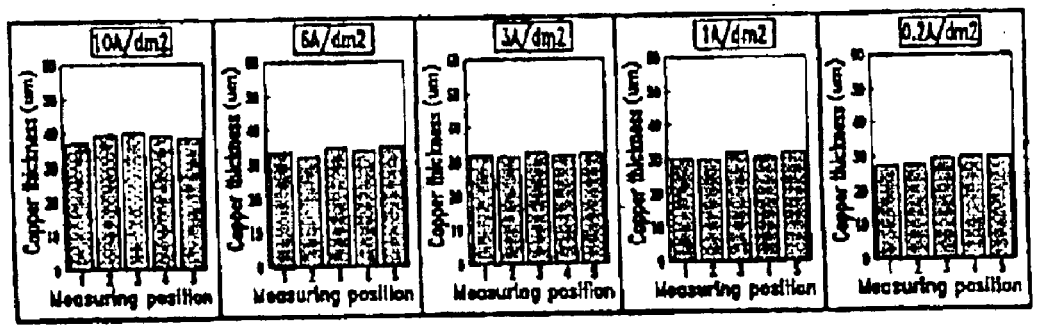
Figure 7:
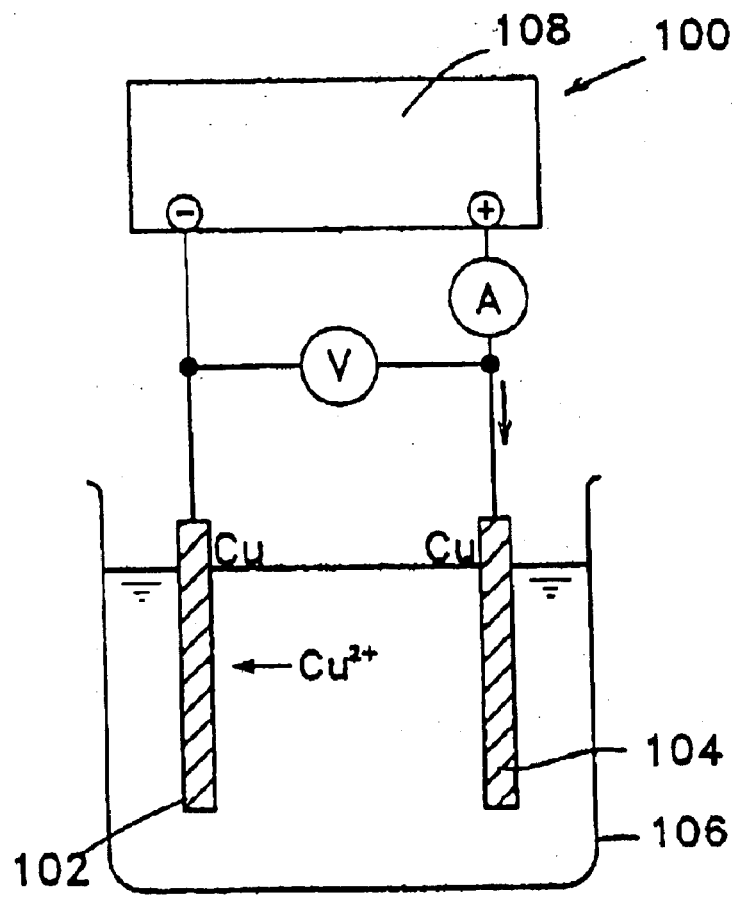
FIG. 7 schematically shows the principle of a conventional metal plating apparatus.
Figure 8:
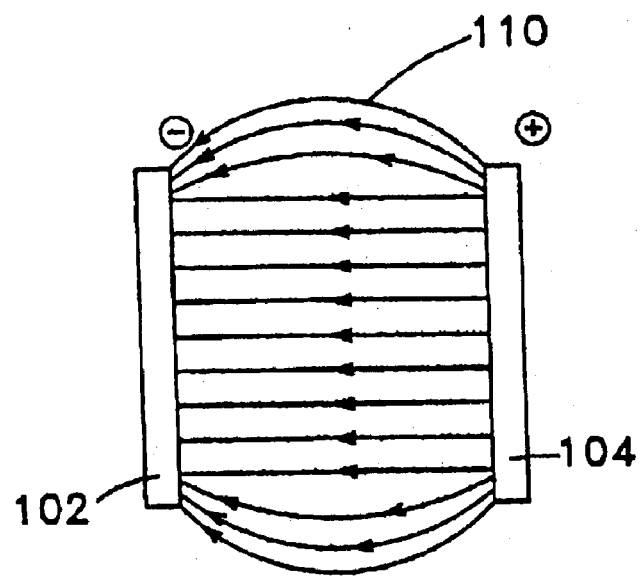
FIG. 8 schematically shows lines of electric force between a cathode and an anode in the conventional metal plating apparatus.

Plating was performed using a metal plating apparatus of the present invention in which an insulating adjustment plate was laid on the conductive perforated plate made of titanium. An adjustment plate made of vinyl chloride (thickness=1 mm) was used. The windows of 0.5 mm in diameter were proportionally allocated for the respective current density based on variations in plating thickness from the average plating thickness obtained from the Comparative Example, and holes were made with a drill. The adjustment plate made of vinyl chloride was mounted on the perforated plate made of titanium with four corners fixed using clips made of vinyl chloride. The other operating conditions were similar to those of the Comparative Example. The spacing between the copper plate including phosphorus and each of the perforated plates made of titanium was 1 cm, and the spacing between the circuit board and each of the perforated plates made of titanium was 1 cm. Respective portions were sampled to measure plating thickness at five sample points for plating current densities of 10A/dm$^2$, 6A/dm$^2$, 3A/dm$^2$, 1A/dm$^2$, and 0.2A/dm$^2$. The result is shown in FIG. 6(c).

FIG. 6 is a graph showing the result of the plating thickness at each current density measured in the Comparison Example, and Examples 1 and 2 in which the y-axis indicates plating thickness (um) and the x-axis indicates measuring position or sample points.

These graphs indicate the following: in the conventional metal plating apparatus (a), there is significant non-uniformity in plating thickness, particularly when its current density is high. In the metal plating apparatus (b) of the present invention equipped with conductive perforated plates, uniform plating thickness can be obtained regardless of its current density. Further, in the metal plating apparatus (c) of the present invention equipped with conductive perforated plates and an insulating adjustment plate, a more accurate and uniform plating layer can be obtained. It is apparent that the plating thickness uniformity achieved by the metal plating apparatus of the present invention is most noticeable at higher current densities. In addition, the graphs reveal that, for example, when the current density is 10A/dm$^2$, while the C.V. value is 26% in a conventional metal plating, the C.V. value is about 7% using perforated plates in the metal plating apparatus according to the present invention. In the case of using perforated plates and an adjustment plate, the corresponding C.V. value decreases even further to about 2%.

Thus, the metal plating apparatus and process of the present invention has been described in detail with reference to the attached drawings. However, the present invention is not limited to these embodiments. Also, any and all modifications, variations or equivalent arrangements which may occur to those skilled in the art should be considered within the scope of the invention.

There has thus been shown and described a metal plating apparatus and a method for performing such process which fulfills all the aspects and advantages sought therefor. Many changes, modifications, variations and other uses and applications of the subject invention will, however, become apparent to those skilled in the art after considering this specification and the accompanying drawings which disclose the preferred embodiments thereof. All changes, modifications, variations and other uses and applications which do not depart from the spirit or scope of the present invention are deemed to be covered by the invention, which is to be limited only by the claims which follow.

What is claimed is:

1. A metal plating apparatus comprising:
a source material electrically connected to a first terminal of a power supply;
an object to be plated electrically connected to a second terminal of the power supply;
at least a pair of conductive perforated plates electrically connected to each other, and the at least pair of conductive perforated plates are disposed between the source material and the object; and
an insulating adjustment plate disposed between the object and the conductive perforated plate on the side of the object, the insulating adjustment plate comprising a plurality of windows corresponding to a plurality of portions of the object to be plated.

2. The metal plating apparatus according to claim 1 further comprising a plating tank filled with a plating solution in which the source material, the object, and the conductive perforated plates are immersed.

3. The metal plating apparatus according to claim 1, wherein said conductive perforated plate disposed on the object side is in ihe vicinity of the object but not in contact with the object, and said conductive perforated plate disposed on the source material side is in the vicinity of the source material but not in contact with the source material.

4. The metal plating apparatus according to claim 3, wherein the at least pair of conductive perforated plates is electrically separated from the source material and the object.

5. The metal plating apparatus according to claim 3, wherein the spacing between said conductive perforated plate disposed on the object side and the object is about 10 cm or less.

6. The metal plating apparatus according to claim 5, wherein the spacing is about 2 cm or less.

7. The metal plating apparatus according to claim 1, wherein the first terminal of the power supply is an anode and the second terminal of the power supply is a cathode.

8. The metal plating apparatus according to claim 1, wherein said pair of conductive perforated plates arc electrically connected by a conductor.

9. The metal plating apparatus according to claim 8, wherein the conductor comprises a material that has a chemical resistance to the plating solution.

10. The metal plating apparatus according to claim 9, wherein the material comprises copper.

11. The metal platang apparatus according to claim 8 further comprising a clip to connect the conductor to said conductive perforated plate.

12. The metal plating apparatus according to claim 11, wherein the clip comprises copper wire covered with vinyl chloride.

13. The metal plating apparatus according to claim 1, wherein the conductive perforated plates and the object to be plated have substantially the same physical dimensions.

14. The metal plating apparatus according to claim 1, wherein the conductive perforated plates comprise holes having a cross-sectional area of about 5 mm square at intervals of about 0.5 mm.

15. The metal plating apparatus according to claim 1, wherein the source material comprises a plating metal including Cu, Ag, Au, Zn, Cd, In, Sn, Pb, Cr, Fe, Co, Ni, Pt, Rh, or the like, or a plating metal alloy including Cu—Zn, Cu—Cd, Au—Ag, Au—Cu, Ag—Cd, Sn—Zn, Ni—Sn, Pb—Sn, Ni—Zn, Ni—Co, Ni—Mo, or the like.

16. The metal plating apparatus according to claim 1, wherein said pair of conductive perforated plates comprise metal insoluble to a plating solution.

17. The metal plating apparatus according to claim 16, wherein said metal comprises titanium or stainless steel.

18. The metal plating apparatus according to claim 1, wherein the insulating adjustment plate is disposed on the surface of the conductive perforated plate on the side of the object.

19. The metal plating apparatus according to claim 1, wherein the windows of said insulating adjustment plate correspond to the plurality of the portions of the object to be plated so that the current density on the object is substantially constant.

20. The metal plating apparatus according to claim 1, wherein said insulating adjustment plate comprises an electrically insulating material including synthetic resin sheets.

21. The metal plating apparatus according to claim 20, wherein the synthetic resin sheets comprise polyester resin, polypropylene resin, polyethylene resin, polyvinylidene fluoride, epoxy resin, phenol resin, polyimide resin, or the like.

* * * * *